United States Patent [19]

Sundström

[11] 4,450,517

[45] May 22, 1984

[54] CURRENT CONTROL CIRCUIT WITH PARTICULAR APPLICATION IN BIPOLAR CONSTANT CURRENT CONTROL OF STEP MOTORS

[76] Inventor: Karl E. Sundström, 114, ch de la Montagne, 1224 Chene-Bougeries, Geneva, Switzerland

[21] Appl. No.: 225,690

[22] Filed: Jan. 16, 1981

[51] Int. Cl.³ ............................................. H02M 7/00
[52] U.S. Cl. ................................ 363/124; 318/345 F; 318/696; 363/131
[58] Field of Search ................ 318/293, 345 B, 345 F, 318/684, 685, 696; 363/18–21, 124, 131

[56] References Cited

U.S. PATENT DOCUMENTS

| | | | |
|---|---|---|---|
| 3,371,259 | 2/1968 | James et al. | 318/345 F X |
| 3,977,024 | 8/1976 | Haneji et al. | 318/696 X |
| 4,107,772 | 8/1978 | Uchida et al. | 363/124 |
| 4,208,868 | 6/1980 | Regnier et al. | 318/696 X |

FOREIGN PATENT DOCUMENTS 23727  2/1980  Japan ................................. 318/696

OTHER PUBLICATIONS

*Electrical Design News*, "Fast-Charging Systems for Ni–Cd Batteries", David A. Zinder, vol. 15, No. 2, pp. 65–67, Jan. 1978.

*Primary Examiner*—William M. Shoop
*Attorney, Agent, or Firm*—Wells & Wells

[57] ABSTRACT

The present invention is a switch mode current control circuit which is particulary useful with step motors. The circuit has a first transistor, a coil and a first resistor connected in a series with a first voltage source. An optocoupler having a light emitting diode and a second transistor therein has the light emitting diode connected across the first resistor and the second transistor is connected across the base emitter junction of the first transistor. A second resistor is connected to the base of the first transistor and to the second voltage source. A diode is connected across the coil.

2 Claims, 3 Drawing Figures

CURRENT CONTROL CIRCUIT WITH PARTICULAR APPLICATION IN BIPOLAR CONSTANT CURRENT CONTROL OF STEP MOTORS

BACKGROUND OF THE INVENTION

The present invention is related to current control in general and in particular to bipolar constant current control in the drive of step motors.

Switch mode current control is a common way of controlling current. Prior art current control systems convert the current to be controlled to a voltage drop across a resistor, a comparator compares this voltage with a reference voltage, and the output of the comparator is brought to control a switch that is pulse width modulated in such a way that the average value of a series of current pulses gives the desired value.

Switching regulators are becoming more and more common. Their particular advantages over series regulators are their high efficiency. In "Computer Design" March 1978 page 103 and following, the disclosure of which is incorporated herein, a universal switching regulator is described. Such a regulator has a reference voltage, a comparator, an oscillator, an operational amplifier, an and-gate, a flip-flop, a switching transistor and a diode.

Simpler prior art systems with voltage regulation such as Lee U.S. Pat. No. 3,435,320 are compleatly inadequate for application in step motor drives since they require a plurality of windings to accomplish the switching of the transistors involved. And step motors are just not equipped with such windings. Furthermore one needs current control not voltage control.

A disadvantage of adequate prior art switching regulators is their relative complexity, which is particularly true in the case when applied to switch mode constant current control in step motor drives. In such applications, current is switched also in a direction through the coils. This is done in order to drive the motor in a given direction and at a given speed. One is here consequently concerned with two different and unrelated types of switching. One is the switchmode current control of the average current through the coils and the other is the direction of the current through the coils for the stepping of the motor.

Bipolar constant current control of step motors is described in a publication by Philips, Amsterdam, Holland, entitled "Electric Motors and Accessoires", April 1977, the disclosure of which is incorporated herein. A drive according to this publication has 46 diodes, 35 transistors, 12 capacitors and 84 resistors.

SUMMARY OF THE INVENTION

It is therefore the object of this invention to create a switch mode current control that is extremely simple and reliable and requires only one winding to function and in particular to apply this current control in stepmotor drives in such a way that the original simplicity is maintained and thereby drastically reducing the number of components used. A very well functioning drive according to the present invention has no external diode, only 12 transistors, no capacitors and only 14 resistors and 4 optocouplers. In its simplest embodiment, the switch mode current-control circuit has a first resistor and a coil coupled in series with a first voltage source. An optocoupler having a lightemitting diode and a second transistor therein has the lightemitting diode connected across the first resistor, and the second transistor is connected across the base-emitter junction of the first transistor. A second resistor is connected to the base of the first transistor and to a second voltage source. A diode is connected across the coil.

BRIEF DESCRIPTION OF THE DRAWINGS

The present invention may best be described by reference to the attached drawing, wherein.

DESCRIPTION OF THE PREFERRED EMBODYMENTS

Figure 1:
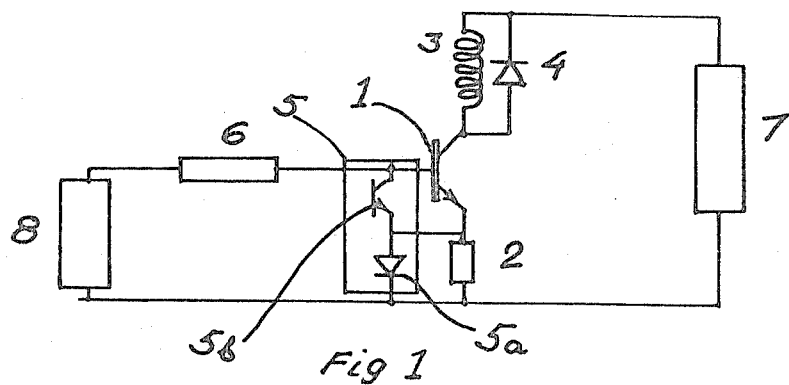
FIG. 1 is a schematic drawing of the switch mode current control according to the present invention.

The function of the circuit according to FIG. 1 is now described in more detail.

A voltage from a power supply or battery 7 is applied to coil 3 over resistor 2 and a transistor 1. This transistor is turned on by a base current supplied by the resistor 6 from the powersupply or battery 8 a current flows through the transistor 1, the resistor 2 and coil 3. The instantaneneous value of this current is determined by the inductance of the coil 3. Here one has the well known voltage and current relationship over time for an inductance connected to a voltage, and since the current also flows through resistor 2, it causes a voltage drop across the resistor. When this voltage is equal to the firing voltage of light emitting diode 5a, in the optocoupler 5, light will result. This light saturates the transistor 5b in the optocoupler 5, which has the effect that the transistor 1 is turned off. Turning the transistor 1 off in turn has the effect that the coil 3 generates a transient current that has polarity that will make the diode 4 conduct. The current flowing through the diode 4 and the coil 3 will temporarily maintain the magnetic field in the coil built up by previous current in it.

When the transistor 5b in the optocoupler is saturated, the capacitance that always exist in such a transistor across collector and emitter and the base emitter capacitance of transistor 1 is discharged. When the current through the resistor 2 has decreased to the point that the light emitting diode 5a is turned off, the capacitance starts to be charged by current flowing through resistor 6. When the voltage on the base of transistor 1 has become high enough to give base current that turns the transistor on, a new current pulse will result. The charging is "slow" since the charging currents are in the order of mA. The discharge however is very rapid since the currents in resistor 2 are in the order of Ampere and the current the transfer ratio of the optocoupler several hundred percent. A "saw tooth" function is generated.

The oscillations so produced are controlled by the voltage drop across resistor 2 produced by the current in coil 3 and resistor 2. One novel and particularly valuable aspect of the present ivention is that the reference for the current control is not a reference voltage, as in prior art current controllers, but the physical characteristic of a light emitting diode. This characteristic is that of firing or emitting light at a given voltage of about 1 volt, thus omitting both conventional reference voltage and the conventional comparator.

Thus this extremely simple combination of circuitelements performs a very complex and valuable function: Generation of an oscillation using one coil only, monitoring a current, generating a wave-form that permits pulse width modulation, comparing the current to a standard, and bringing this comparison to modulate the pulse width in such a way that the current is accuratly controlled.

Figure 2:
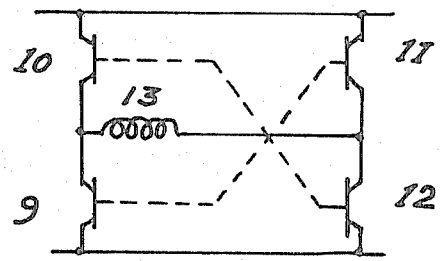
FIG. 2 is a simplified diagram of a bipolar step motor coil drive.

FIG. 2 is simplified schematic diagram of a bipolar step motor drive, having one coil. A motor typically has two or more coils driven in a similar manner. It is generally accepted in the art to represent the bipolar drive in this simple way.

Elements 9, 10, 11, and 12 are switching transistors and 13 is one motor coil. Transistors 9 and 11 are turned on at the same time as transistors 10 and 12 are turned off, and vice versa. This is indicated by dotted lines in FIG. 2 Since it is outside the scope of this invention to contribute to the switching of the direction of the current through the coils of a step motor this feature is not treated at length.

Figure 3:
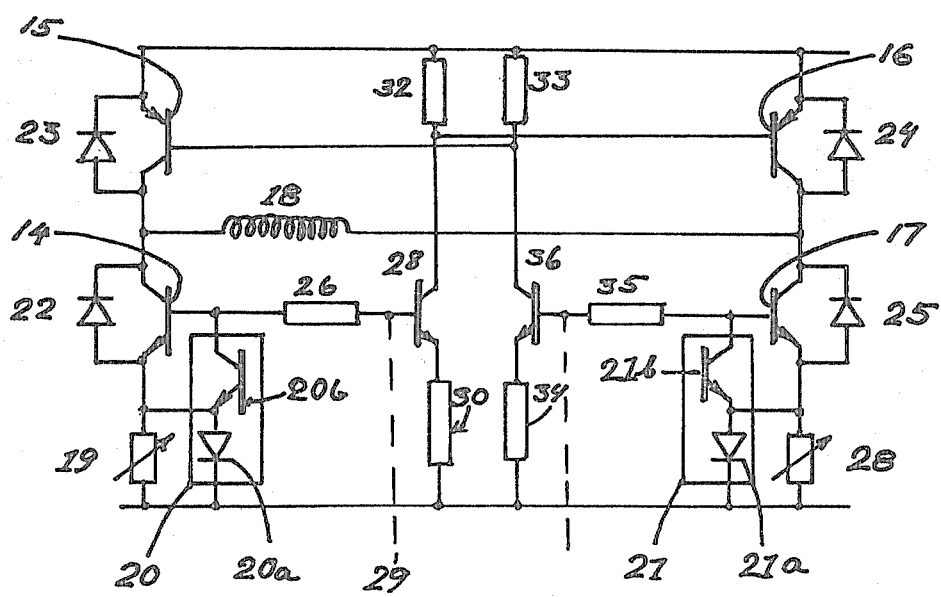
FIG. 3 is schematic drawing of the present invention applied to a constant current control in a step motor coil drive.

FIG. 3 is a schematic diagram of a bipolar drive of a step motor coil incorporating the present invention of a switch mode current control circuit as described in connection with FIG. 1 above.

The dotted line 29 indicates that the transistors 14 and 28 are turned on at the same time. Turning transistor 28 on has the effect that current flows through resistor 30 and 32 and trough the base-emitter junction of transistor 16. Resistor 30 limits the current flowing through transistor 28. Resistor 32 connects the base of transistor 16 to its emitter when transistor 28 is turned off. Transistor 14 and 16 are turned on at the same time and thus current flows through the coil 18 from transistors 16 to 14. Current also flows through resistor 19. This resistor 19 has the same function in this bipolar drive as resistor 2 described in relation to FIG. 1. Optocoupler 20 having LED 20a and transistor 20b controls the average current through transistor 14 and the coil 18. When transistors 14 and 16 are turned on, transistors 15 and 17 are turned off.

When transistors 36 and 17 are turned on the current flows in the other direction through the coil 18 and resistor 28, optocoupler 21 controls the average current through transistor 17.

Transistors 14, 15, 16 and 17 have diodes 22, 23, 24 and 25 connected across them respectively. Resistors 26 and 27 function in their respective circuits as does resistor 6 of FIG. 1.

It is preferable to use optocouplers with Darlington transistors such as those designated 4 N 33 since that increases the overall gain in the system and the longer time constants of these devices gives ideal switching frequancy, in practice, without additional components.

It is also preferable to use Darlington transistors as switch transistors since they have high gain and have incorporated diodes.

It is possible to use two resistors in series with the coil with one optocoupler in parallel with each resistor of which each one can be individually adjusted, and it is possible to rearrange the order of the resistors, coil and transistors without deviating from the spirit of the invention.

Of cource, it is possible to add several components to the circuit without deviating from the spirit of the invention.

I claim:

1. A switch mode current control circuit comprising:
    a first transistor having a base emitter junction, a first resistor, a coil and a first voltage source, all connected in series;
    an optocoupler having a second transistor and a light emitting diode connected thereto, said second transistor connected across said base emitter junction;
    a second resistor connected across said base emitter junction and a second voltage source connected to said second resistor; and
    a diode connected across said coil.

2. A switch mode current circuit comprising: a first transistor having a first base and a first base emitter junction, a first resistor, a coil and a voltage source, all connected in series;
    a first optocoupler having a second transistor and a first light emitting diode, said first light emitting diode connected across said first resistor and said second transistor connected across said first base emitter junction;
    a second resistor connected across said first base and the base of a third transistor;
    a fourth transistor having a base connected to the collector of said third transistor. A fourth resistor connected across the base emitter terminals of said fourth transistor;
    a third resistor connected across the emitter of said third transistor and the chatode of the lightemitting diode of said optocoupler;
    a fifth transistor having a first base and base-emitter junction a fifth resistor said coil and a voltagesource all connected in series;
    a second optocoupler having a sixth transistor and a second lightemitting diode, said second lightemitting diode connected across said fifth resistor and said second transistor connected across said first base-emitter junction;
    a sixth resistor connected across said second base and the base of a seventh transistor;
    an eighth transistor having a base connected to the collector of said seventh transistor, a fourth resistor connected across the base emitter terminal of said eighth transistor;
    a seventh resistor connected across the emitter of said third transistor and the chatode of the lightemitter diode of said second optocoupler.

* * * * *